United States Patent [19]

Landram

[11] Patent Number: 4,649,085

[45] Date of Patent: Mar. 10, 1987

[54] CRYOGENIC GLASS-TO-METAL SEAL

[75] Inventor: Mark O. Landram, Florissant, Mo.

[73] Assignee: The United States of America as represented by the Secretary of the Air Force, Washington, D.C.

[21] Appl. No.: 645,389

[22] Filed: Aug. 29, 1984

[51] Int. Cl.⁴ .......... H01L 29/12

[52] U.S. Cl. .......... 428/620; 428/433; 428/434; 428/630; 428/631; 428/632; 428/633; 428/657; 428/658

[58] Field of Search .......... 428/433, 434, 630–633, 428/620, 657, 658

[56] References Cited

U.S. PATENT DOCUMENTS

| | | | |
|---|---|---|---|
| 2,671,746 | 3/1954 | Brew | 154/128 |
| 2,964,839 | 12/1960 | Marafioti et al. | 29/195 |
| 3,115,957 | 12/1963 | Heil | 189/36.5 |
| 3,138,228 | 6/1964 | Bondley | 189/36.5 |
| 3,293,065 | 12/1966 | Roetter | 428/433 |
| 4,210,389 | 7/1980 | Burkhart et al. | 428/630 |
| 4,428,523 | 1/1984 | Snitzer et al. | 228/121 |

OTHER PUBLICATIONS

IBM Technical Disclosure Bulletin, vol. 16, No. 1, 6/1973, L. F. Miller, p. 39.

*Primary Examiner*—George F. Lesmes
*Assistant Examiner*—P. R. Schwartz
*Attorney, Agent, or Firm*—Bobby D. Scearce; Donald J. Singer

[57] ABSTRACT

A novel low temperature vacuum seal and method of making same for joining a nonmetallic element, such as an optical port, to a metallic element is described which comprises first and second thin metallic layers applied to the nonmetallic element to provide substantial adhesion and solderability to the nonmetallic element, and a third metallic layer applied to the metallic element to provide solderability to the metallic element, the nonmetallic and metallic elements being joined by a layer of low temperature solder interfacing their respective solder surfaces. A further thin metallic layer may be applied to the nonmetallic element to provide substantial wetability to the solderable second layer.

7 Claims, 2 Drawing Figures

CRYOGENIC GLASS-TO-METAL SEAL

RIGHTS OF THE GOVERNMENT

The invention described herein may be manufactured and used by or for the Government of the United States for all governmental purposes without the payment of any royalty.

BACKGROUND OF THE INVENTION

This invention relates generally to cryogenic glass-to-metal type vacuum seals and more particularly to a novel seal structure and method for producing a seal which maintains a vacuum with minimal stress at low temperature.

Existing cryogenic vacuum systems having optical ports generally comprise windows of substantially flat glass plates bolted onto a flange with metal or rubber gaskets. The glass-to-metal type seal structures of existing systems generally include gaskets of Kovar TM, stainless steel, and copper or like structures which tend to lose their seal and require remount after a thermal cycle to cryogenic temperatures.

The present invention provides a low temperature vacuum seal structure between a nonmetallic element, such as an optical port, and a metallic element or housing wherein thin metallic layers are applied to the nonmetallic element for adhesion and solderability and a metallic layer is applied to the housing for solderability, and a solder layer (e.g., indium) interfaces the layers on the nonmetallic element and housing to provide a vacuum seal therebetween.

The seal structure and method of the present invention may find substantial utility within closed cryogenic vacuum systems having optical ports exposed to the cryogenic temperatures, such as in laser systems utilizing vacuum enclosures. Nonmetallics sealable according to the invention may comprise a wide variety of materials including glass, fused silica, quartz, or semiconductor material such as ZnSe for use with the infrared output of a laser. Optics mounted with the seal structure according to the present invention may function at cryogenic temperatures without frequent remounting or resealing. Optical elements comprising lenses, aspherics and the like, including coated optics and dielectrics, may be bonded and sealed directly to substantially any type of receiving metallic housing without the use of adhesives, gaskets or washers, and the optical elements may assume substantially any size or shape, and yet retain a seal against radiation exposure and repeated thermal cycling between about −330° F. and about +250° F.

It is therefore, a principal object of the present invention to provide an improved nonmetal-to-metal seal.

It is a further object of the invention to provide an improved seal structure which will maintain a vacuum at low temperature.

It is a further object of the invention to provide an improved seal structure which will maintain a low stress in the nonmetallic element at low temperatures.

It is yet another object of the invention to provide an improved low temperature vacuum sealed laser window.

It is a further object of the invention to provide an improved method for making a cryogenic glass-to-metal type vacuum seal.

These and other objects of the present invention will become apparent as the detailed description of certain representative embodiments thereof proceeds.

SUMMARY OF THE INVENTION

In accordance with the foregoing principles and objects of the present invention, a novel low temperature vacuum seal and method of making same for joining a nonmetallic element, such as an optical port, to a metallic element is described which comprises first and second thin metallic layers applied to the nonmetallic element to provide substantial adhesion and solderability to the nonmetallic element, and a third metallic layer applied to the metallic element to provide solderability to the metallic element, the nonmetallic and metallic elements being joined by a layer of low temperature solder interfacing their respective solder surfaces. A further thin metallic layer may be applied to the nonmetallic element to provide substantial wetability to the solderable second layer thereon.

DESCRIPTION OF THE DRAWINGS

The present invention will be more clearly understood from the following description of certain representative embodiments thereof read in conjunction with the accompanying drawings wherein.

DETAILED DESCRIPTION

Figure 1:
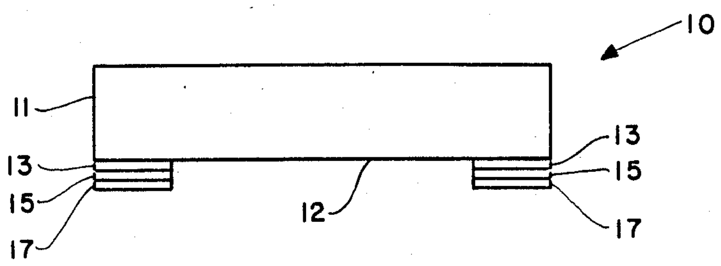
FIG. 1 is a schematic cross section of an optical element including the layers thereon comprising a part of the seal structure of the present invention.

Referring now to FIG. 1 of the drawings, shown therein is an element 10 prepared for soldering according to the present invention. Element 10 may comprise an optical window 11 in the form of an optical port, lens, laser mirror, laser output coupler, or like optical devices of substantially any construction material (e.g., silica, glass, or quartz, or semiconductor materials such as zinc selenide (ZnSe), mercury telluride (HgTe), or the like) and may be of substantially any size and shape (e.g. flat plate, lens, mirror or detector), the same not being restrictive of the teachings herein. Further, window 11 may comprise an otherwise conventional coated optical element such as utilized in the cavity optics of laser systems or in optical trains used to direct laser output beams.

According to the present invention, element 10 may preferably be selected and configured to effect a cryogenic glass-to-metal type vacuum seal. Multiple metallic layers 13,15,17 may therefore be applied around a periphery on a selected surface 12 of window 11 in order to provide a suitable solderable surface thereon. Layers 13,15,17 may be selected for material composition depending on the material and composition of window 11, layer 13 material being selected to provide substantial adhesion to surface 12 of window 11, layer 15 material being selected to provide solderability, and layer 17 material, if required, being selected to provide or enhance wetability of the solder surface provided by layer 15. For a window of glass, silica, ZnSe, or HgTe, layer 13 may preferably comprise titanium, chromium, nickel chromium, or aluminum of from about 600 to about 1000 Angstroms in thickness, layer 15 may preferably comprise platinum, nickel, or copper of from about 1500 to about 3000 Angstroms in thickness, and layer 17 may preferably comprise gold, copper, silver, or tin of from about 1000 to about 3000 Angstroms in thickness. It is noted that the thicknesses of layers 13,15,17 as illustrated in FIG. 1 are exaggerated for clarity. All three layers may be deposited by conventional techniques, although sputtering may be preferred for optimum adhesion of the layers.

Figure 2:
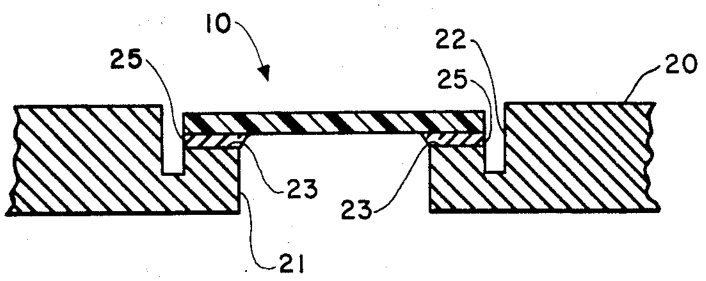
FIG. 2 is a schematic cross-section of an optical window sealed to a supporting housing according to the present invention.

FIG. 2 is a sectional view of a cryogenic vacuum seal which may be made between element 10 of FIG. 1 and a metallic housing 20, in order to seal element 10 over an opening 21 in housing 20. A solderable layer 23 is first applied to the flanged surface of a recess 22 which may be optionally provided in housing 20 to receive element 10 for soldering. Recess 22 may be sized and configured to provide an annular gap around element 10 and an annular shoulder supporting layer 23 substantially as shown to allow for differences in thermal expansion of element 10 and housing 20. The composition of solderable layer 23 is selected to be compatible with the metal of housing 20 and to promote wetting of the solder surface. For a housing 20 of aluminum, layer 23 preferably comprises zinc, tin, or copper vapor deposited or electroplated to a thickness of about 1 to 10 microns. For a titanium housing 20, layer 23 may comprise a first layer of copper about 1 to 5 microns thick overlaid with a vapor deposited indium layer of similar thickness.

Element 10 may then be sealed to housing 20 by applying a solder seal 25 at the contacting surfaces substantially as shown in FIG. 2. The soldering of element 10 to housing 20 is performed using a low temperature solder, such as indium, bismuth/indium, or indium/tin/lead in order to minimize strain on the solder interface at cryogenic temperatures. The solder seal may be applied conventionally through heat application by torch or the like, by oven heating of the parts, or like soldering processes, depending on the sizes of the parts to be soldered. Although other solders may be usable, indium may be preferred for its low melting point, vacuum compatibility, ductility and radiation resistance.

The present invention therefore provides a novel nonmetal to metal low stress cryogenic vacuum seal structure and method for making same comprising thin metallic layers applied to the nonmetallic for adhesion and solderability and a metallic layer applied to the metal for solderability, the nonmetal being soldered to the metal using low temperature solder. It is understood that certain modifications to the invention as described may be made, as might occur to one with skill in the field of this invention, within the scope of the appended claims. Therefore, all embodiments contemplated hereunder which achieved the objects of the present invention have not been shown in complete detail. Other embodiments may be developed without departing from the spirit of the invention or from the scope of the appended claims.

I claim:

1. A low temperature vacuum seal structure, wherein an optical material selected from the group consisting of silica, glass, quartz, and semiconductor material is joined to a element of metal or alloy, comprising:

(a) a first thin layer of metal on said optical material to provide substantial adhesion to said optical material, said first layer comprising a material selected from the group consisting of titanium, chromium, copper, zinc and tin;

(b) a second thin layer of metal on said optical material over said first layer to provide solderability to said optical material, said second layer comprising a material selected from the group consisting of platinum, nickel and copper;

(c) a third layer of metal on said element in registration with said first and second layers to provide solderability to said element, said third layer comprising a material selected from the group consisting of titanium, chromium, copper, zinc and tin;

(d) a layer of solder between said optical material and element and interfacing the lastly applied layer on said optical material element and said third layer on said element; and, (e) wherein adjacent layers, including said element, consist essentially of different materials.

2. The seal structure as recited in claim 1 further comprising a fourth layer on said optical material over said second layer to provide substantial wetability to said second layer.

3. The seal structure as recited in claim 2, wherein said fourth layer comprises a metal selected from the group consisting of gold, copper, silver and tin.

4. The seal structure as recited in claim 1, wherein said optical material comprises a material selected from the group consisting of glass, fused silica, zinc selenide and mercury telluride.

5. The seal structure as recited in claim 1, wherein said solder layer comprises indium.

6. A low temperature vacuum seal structure, wherein an optical material selected from the group consisting of silica, glass, quartz, and semiconductor material is joined to a element of metal or alloy, comprising:

(a) a first thin layer of titanium on said optical material to provide substantial adhesion to said optical material;

(b) a second thin layer of platinum on said optical matermial over said first layer to provide solderability to said optical material;

(c) a third thin layer comprising a material selected from the group consisting of copper, zinc and tin on said element in registration with said first and second layers to provide solderability to said element; and, (d) a layer of indium solder between said optical material and element and interfacing said last applied layer on said optical material and the third layer on said element.

7. The seal structure as recited in claim 6 further comprising a fourth thin layer of gold on said optical material to provide substantial wetability to said second layer.

* * * * *

UNITED STATES PATENT AND TRADEMARK OFFICE

CERTIFICATE OF CORRECTION

PATENT NO. : 4,649,085

DATED : March 10, 1987

INVENTOR(S) : Mark O. Landram

It is certified that error appears in the above-identified patent and that said Letters Patent is hereby corrected as shown below:

Column 3, line 53, "achieved" should read --achieve--.

Column 4, line 45, "matermial" should read --material--.

Signed and Sealed this

Twentieth Day of October, 1987

*Attest:*

DONALD J. QUIGG

*Attesting Officer*

*Commissioner of Patents and Trademarks*